United States Patent [19]

Wei

[11] Patent Number: 5,105,442

[45] Date of Patent: Apr. 14, 1992

[54] CODED MODULATION WITH UNEQUAL ERROR PROTECTION

[75] Inventor: Lee-Fang Wei, Lincroft, N.J.

[73] Assignee: AT&T Bell Laboratories, Murray Hill, N.J.

[21] Appl. No.: 611,200

[22] Filed: Nov. 7, 1990

[51] Int. Cl.$^5$ .......................................... H04L 27/34
[52] U.S. Cl. ...................................... 375/39; 375/34; 375/58; 358/13
[58] Field of Search ............... 375/34, 39, 42, 53, 375/54, 57, 58; 370/18, 20, 21, 110.1, 110.4; 371/30, 43; 358/13, 15, 143

[56] References Cited

U.S. PATENT DOCUMENTS

| | | | |
|---|---|---|---|
| 4,520,490 | 5/1985 | Wei | 375/27 |
| 4,597,090 | 6/1986 | Forney, Jr. | 375/42 |
| 4,601,044 | 7/1986 | Kromer, III et al. | 371/43 |
| 4,641,179 | 2/1987 | Locicero et al. | 358/15 |
| 4,651,320 | 3/1987 | Thapar | 375/39 |
| 4,882,733 | 11/1989 | Tanner | 371/43 |

Primary Examiner—Benedict V. Safourek
Attorney, Agent, or Firm—Ronald D. Slusky

[57] ABSTRACT

Digital signals, such as digitized television signals, are subjected to a source coding step in which a class of "most important" data elements represents a proportionately greater amount of the information to be communicated than the rest of the data elements. This is followed by a constellation mapping step which is carried out in such a way that those data elements have a lower probability of being erroneously detected at the receiver than the others. The constellation mapping step uses coded modulation in order to provide enhanced noise immunity for the "most important" data element class.

35 Claims, 8 Drawing Sheets

FIG. 7

| TWO-DIMENSIONAL CONSTELLATION | $d_1/d_2$ | FRACTION OF MOST IMPORTANT BITS (%) | CHANNEL ENCODERS | CODING GAIN FOR MOST IMPORTANT BITS (dB) | CODING GAIN FOR LESS IMPORTANT BITS (dB) |
|---|---|---|---|---|---|
| FIGURE 4 | 2.5 | 50 | FIGURE 6 | 5.7 | -2.8 |
| FIGURE 4 | 3.5 | 50 | FIGURE 6 | 6.6 | -4.6 |
| FIGURE 8 | 2 | 37.5 | FIGURE 9 | 7.3 | -0.1 |
| FIGURE 8 | 3 | 37.5 | FIGURE 9 | 9.1 | -1.8 |
| FIGURE 8 | 4 | 37.5 | FIGURE 9 | 10.2 | -3.2 |
| FIGURE 12 | 2 | 62.5 | FIGURE 13 | 5.1 | -1.1 |
| FIGURE 12 | 3 | 62.5 | FIGURE 13 | 5.9 | -3.5 |

| INPUT BIT PATTERN OF BIT CONVERTER | FIRST OUTPUT BIT PATTERN | SECOND OUTPUT BIT PATTERN |
|---|---|---|
| 0 0 0 0 | 0 0 | 0 0 |
| 0 0 0 1 | 0 0 | 0 1 |
| 0 0 1 0 | 0 0 | 1 1 |
| 0 0 1 1 | 0 0 | 1 0 |
| 0 1 0 0 | 0 1 | 0 1 |
| 0 1 0 1 | 0 1 | 1 1 |
| 0 1 1 0 | 0 1 | 1 0 |
| 0 1 1 1 | 0 1 | 0 0 |
| 1 0 0 0 | 1 1 | 1 1 |
| 1 0 0 1 | 1 1 | 1 0 |
| 1 0 1 0 | 1 1 | 0 0 |
| 1 0 1 1 | 1 1 | 0 1 |
| 1 1 0 0 | 1 0 | 1 0 |
| 1 1 0 1 | 1 0 | 0 0 |
| 1 1 1 0 | 1 0 | 0 1 |
| 1 1 1 1 | 1 0 | 1 1 |

CODED MODULATION WITH UNEQUAL ERROR PROTECTION

BACKGROUND OF THE INVENTION

The present invention relates to the transmission of digital data, particularly the transmission of digital data which represents video signals.

It is generally acknowledged that some form of digital transmission will be required for the next generation of television technology, conventionally referred to as high definition television, or HDTV. This requirement is due mostly to the fact that much more powerful video compression schemes can be implemented with digital signal processing than with analog signal processing. However, there has been some concern about getting committed to an all-digital transmission system because of the potential sensitivity of digital transmission to small variations in signal-to-noise ratio, or SNR, at the various receiving locations.

This phenomenon—sometimes referred to as the "threshold effect"—can be illustrated by considering the case of two television receivers that are respectively located at 50 and 63 miles from a television broadcast station. Since the power of the broadcast signal varies roughly as the inverse square of the distance, it is easily verified that the difference in the amount of signal power received by the television receivers is about 2 dB. Assume, now, that a digital transmission scheme is used and that transmission to the receiver that is 50 miles distant exhibits a bit-error rate of $10^{-6}$. If the 2 dB of additional signal loss for the other TV set translates into a 2 dB decrease of the SNR at the input of the receiver, then this receiver will operate with a bit-error rate of about $10^{-4}$. With these kinds of bit-error rates, the TV set that is 50 miles away would have a very good reception, whereas reception for the other TV set would probably be very poor. This kind of quick degradation in performance over short distances is generally not considered acceptable by the broadcasting industry. (By comparison, the degradation in performance for presently used analog TV transmission schemes is much more graceful.)

There is thus required a digital transmission scheme adaptable for use in television applications which overcomes this problem. Solutions used in other digital transmission environments—such as the use of a) regenerative repeaters in cable-based transmission systems or b) fall-back data rates or conditioned telephone lines in voiceband data applications—are clearly inapplicable to the free-space broadcast environment of television.

The co-pending, commonly assigned patent application of V. B. Lawrence et al entitled "Coding for Digital Transmission" discloses an advantageous technique for overcoming the shortcomings of standard digital transmission for over-the-air broadcasting of digital TV signals, which method comprises a particular type of source coding step followed by a particular type of channel mapping step. More specifically, the source coding step causes the television signal to be represented by two or more data streams while, in the channel mapping step, the mapping is such that the data elements of the various data streams have differing probabilities of being erroneously detected at the receiver. Illustratively, a first one of the aforementioned data streams carries components of the overall television signal which are regarded as the most important— for example, the audio, the framing information, and the vital portions of the video information—and that data stream is mapped such that its data elements have the lowest probability of error. A second one of the data streams carries components of the overall television signal which are regarded as less important than those of the first data stream and that data stream is mapped such that its data elements have a probability of error that is not as low as those of the first data stream. In general, it is possible to represent the overall television signal with any number of data streams, each carrying components of varying importance and each having a respective probability of error. This approach allows a graceful degradation in reception quality at the TV set location because, as the bit error rate at the receiver begins to increase with increasing distance from the broadcast transmitter, it will be the bits that represent proportionately less of the TV signal information that will be the first to be be affected.

SUMMARY OF THE INVENTION

In accordance with the present invention, I have devised a scheme which implements the above-described overall concept of the Lawrence et al application—i.e., provides different levels of error protection for different classes of data elements generated by the source encoding step—but which provides enhanced noise immunity via the use of coded modulation, such as trellis-coded modulation.

In preferred embodiments of the invention, in particular, the symbols in a predetermined 2N-dimensional channel symbol constellation, $N \geq 1$, are divided into groups, each of which is referred to herein as a "supersymbol." During each of a succession of symbol intervals, a predetermined number of the most important data elements are channel encoded, and the resulting channel coded data elements identify a particular one of the supersymbols. The remaining data elements, which may also be channel encoded, are used to select for transmission a particular symbol from the identified supersymbol.

The approach as thus far described is similar in a general way to conventional coded modulation schemes in that the latter also divide the channel symbols into groups, typically referred to as "subsets." However, the prior art subsets are formed under the constraint that the minimum Euclidean distance (hereinafter referred to as the "minimum distance") between the symbols in a subset is greater than the minimum distance between the symbols in the constellation as a whole. In accordance with the present invention, however, the minimum distance between the symbols of a supersymbol is the same as the minimum distance between the symbols in the constellation as a whole. It is this distance property which allows for greater amount of noise immunity for the most important data elements than for the other data elements, that immunity being optimized by keeping the minimum distance between supersymbols as large as possible—usually greater than the minimum distance of the constellation. Specifically, once the supersymbols are defined, it is possible to design codes for the most important data elements based on the distances between the supersymbols, i.e., as though each supersymbol were a conventional symbol in a conventional constellation. This being so, a particular degree of noise immunity can be achieved for the most important data elements that is greater than what can be achieved for the other data elements.

Indeed, a tradeoff is involved in that those other data elements suffer a coding loss, i.e., a somewhat lessened noise immunity. Importantly, however, the coding gain that can be achieved for the most important data elements is greater than that which can be achieved using conventional coded modulation schemes.

BRIEF DESCRIPTION OF THE DRAWING

In the drawing,

FIG. 7 is a table comparing the performance of the various illustrative embodiments of the invention disclosed herein;

DETAILED DESCRIPTION

Before proceeding with a description of the illustrative embodiments, it should be noted that the various digital signaling concepts described herein—with the exception, of course, of the inventive concept itself—are all well known in, for example, the digital radio and voiceband data transmission (modem) arts and thus need not be described in detail herein. These include such concepts as multidimensional signaling using 2N-dimensional channel symbol constellations, where N is some integer; trellis coding; scrambling; passband shaping; equalization; Viterbi, or maximum-likelihood, decoding; etc. These concepts are described in such U.S. patents as U.S. Pat. No. 3,810,021, issued May 7, 1974 to I. Kalet et al.; U.S. Pat. No. 4,015,222, issued Mar. 29, 1977 to J. Werner; U.S. Pat. No. 4,170,764, issued Oct. 9, 1979 to J. Salz et al.; U.S. Pat. No. 4,247,940, issued Jan. 27, 1981 to K. H. Mueller et al.; U.S. Pat. No. 4,304,962, issued Dec. 8, 1981 to R. D. Fracassi et al.; U.S. Pat. No. 4,457,004, issued June 26, 1984 to A. Gersho et al.; U.S. Pat. No. 4,489,418, issued Dec. 18, 1984 to J. E. Mazo; U.S. Pat. No. 4,520,490, issued May 28, 1985 to L. Wei; and U.S. Pat. No. 4,597,090, issued June 24, 1986 to G. D. Forney, Jr.—all of which are hereby incorporated by reference.

Figure 1:
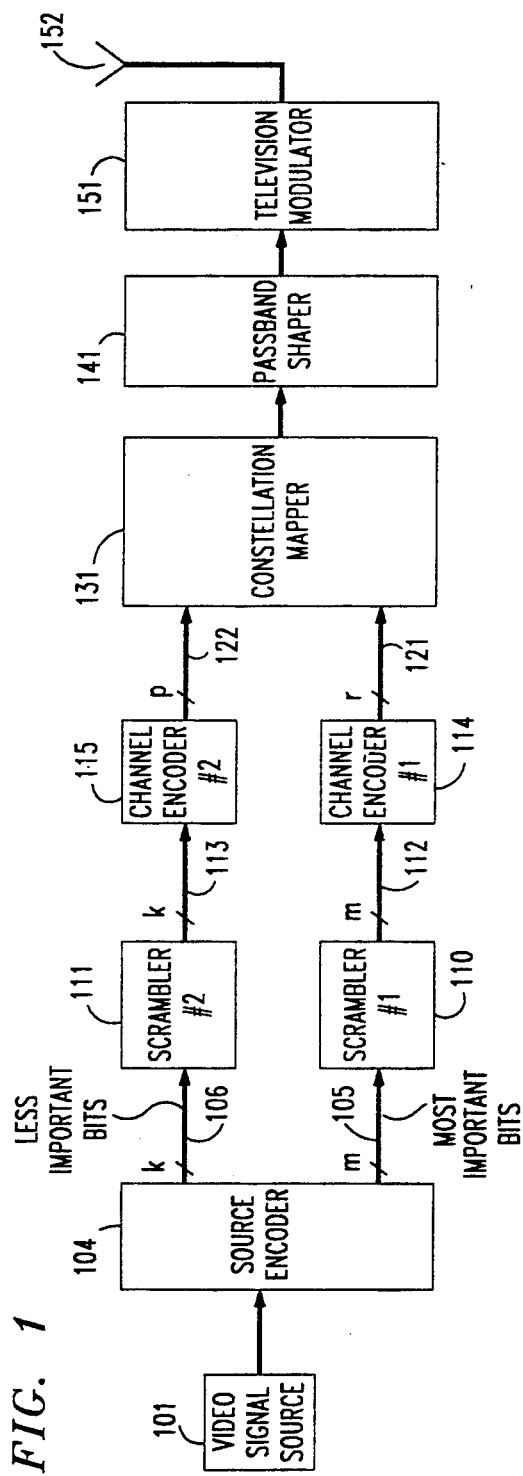
FIG. 1 is a block diagram of a transmitter embodying the principles of the invention.

Turning now to FIG. 1, video signal source 101 generates an analog video signal representing picture information or "intelligence" which signal is passed on to source encoder 104. The latter generates a digital signal in which at least one subset of the data elements represents a portion of the information, or intelligence, that is more important than the portion of the information, or intelligence, represented by the rest of the data elements. Illustratively, each data element is a data bit, with m+k information bits being generated for each of a succession of symbol intervals. The symbol intervals are comprised of N signalling intervals, where 2N is the number of dimensions of the constellation (as described below). The signaling intervals have duration of T seconds and, accordingly, the symbol intervals each have a duration of NT seconds. In embodiments using two-dimensional constellations, i.e., N=1, then of course the signaling intervals and the symbol intervals are the same.

Of the aforementioned m+k information bits, the bits within the stream of m bits per symbol interval, appearing on lead 105, are more important than the bits within the stream of k bits per symbol interval, appearing on lead 106. Two examples of how one might generate a television signal of this type are given hereinbelow.

The bits on leads 105 and 106 are independently scrambled in scramblers 110 and 111, which respectively output m and k parallel bits on leads 112 and 113. (Scrambling is customarily carried out on a serial bit stream. Thus although not explicitly shown in FIG. 1, scramblers 110 and 111 may be assumed to perform a parallel-to-serial conversion on their respective input bits prior to scrambling and a serial-to-parallel conversion at their outputs.) In accordance with the invention, as described more fully hereinbelow, the respective groups of bits on leads 112 and 113 are extended to channel encoders—illustratively trellis encoders—114 and 115 which generate, for each symbol interval, respective expanded groups of the expanded r and p bits on leads 121 and 122, where r>m and p>k. The values of those bits jointly identify a particular channel symbol of a predetermined constellation of channel symbols (such as the constellation of FIG. 4 as described in detail hereinbelow). Complex plane coordinates of the identified channel symbol are output by constellation mapper 131, illustratively realized as a lookup table or as a straightforward combination of logic elements. Conventional passband shaping and television modulation are then performed by passband shaper 141 and television modulator 151, respectively. The resultant analog signal is then broadcast via antenna 152 over a communication channel, in this case a free-space channel.

Figure 3:
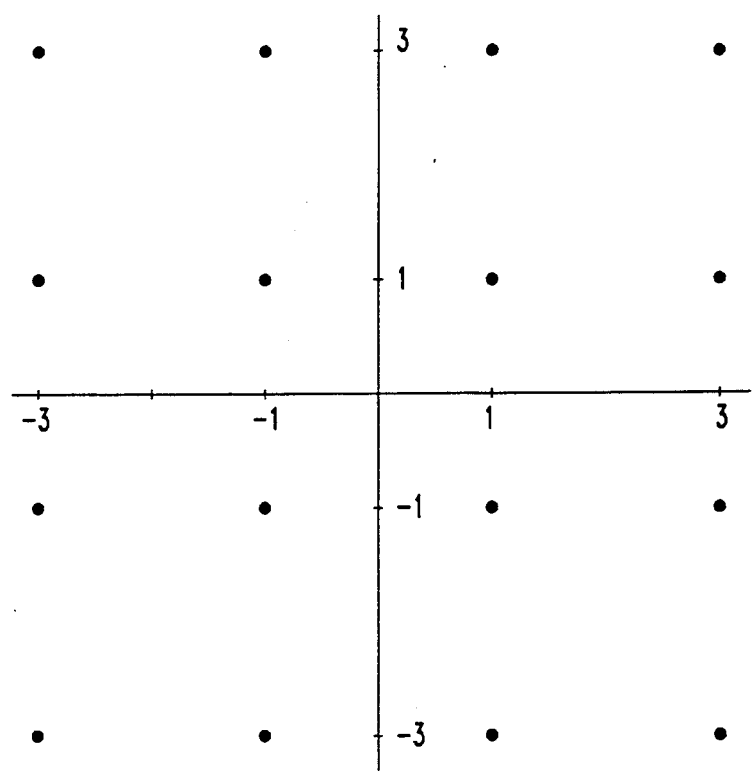
FIG. 3 depicts a prior art signal constellation.

In order to understand the theoretical underpinnings of the invention, it will be useful at this point to digress to a consideration of FIG. 3. The latter depicts a standard two-dimensional data transmission constellation of the type conventionally used in digital radio and voiceband data transmission systems. In this standard scheme—conventionally referred to as quadrature-amplitude modulation (QAM)—data words each comprised of four information bits are each mapped into one of 16 possible two-dimensional channel symbols. Each channel symbol has an in-phase, or I, coordinate on the horizontal axis and has a quadrature-phase, or Q, coordinate on the vertical axis. Note that, on each axis, the channel symbol coordinates are ±1 or ±3 so that the distance between each symbol and each of the symbols that are horizontally or vertically adjacent to it is the same for all symbols—that distance being "2". As a result of this uniform spacing, essentially the same amount of noise immunity is provided for all four information bits.

As is well known, it is possible to provide improved noise immunity without sacrificing bandwidth efficiency (information bits per signaling interval) using a coded modulation approach in which an "expanded" two-dimensional constellation having more than (in this example) 16 symbols is used in conjunction with a trellis or other channel code. For example, my above-cited '490 patent discloses the use of a 32-symbol, two-dimensional constellation together with an 8-state trellis code. That coded modulation scheme achieves approximately 4 dB of enhanced noise immunity over the uncoded case of FIG. 3, while still providing for the transmission of four information bits per signaling interval. Here, too, however, essentially the same amount of noise immunity is provided for all four information bits.

In accordance with the invention, the known noise immunity and bandwidth efficiency advantages of coded modulation are achieved while providing different levels of error protection to different classes of bits. Specifically, I have discovered that it is possible to achieve a level of error protection for a class of "most important" bits which is substantially greater than what can be achieved with the aforementioned conventional coded modulation approach. Indeed, the transmitter of FIG. 1 embodies the inventive concept, as will now be described in further detail.

Figure 4:
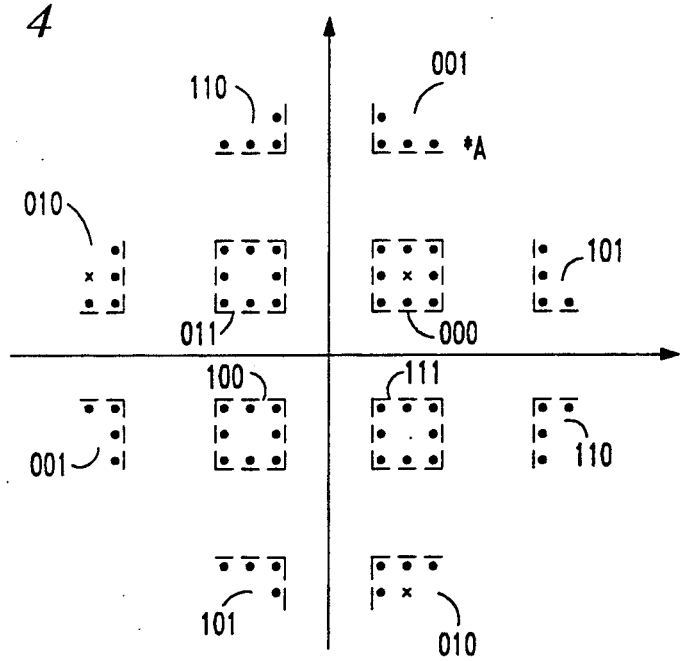
FIG. 4 depicts a signal constellation illustratively used by the transmitter of FIG. 1.
Figure 4:
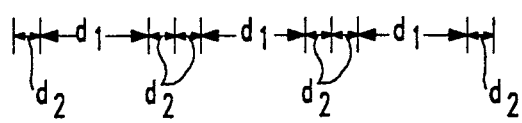

The constellation used in the transmitter of FIG. 1 is illustratively the two-dimensional 64-symbol constellation shown in FIG. 4 (each symbol is represented as a dot in the figure). In accordance with the invention, the symbols in the signal constellation are divided into groups which I refer to as "supersymbols." Specifically, the constellation of FIG. 4 is divided into $2^r = 2^3 = 8$ supersymbols. Four of the supersymbols, labeled 000, 011, 100 and 111, are each comprised of eight contiguous channel symbols assigned to that supersymbol. The other four supersymbols, labeled 001, 010, 101 and 110, are each comprised of two non-contiguous groups, each comprised of four contiguous channel symbols. (The use of such two-group supersymbols allows the overall constellation to have, for example, better signal-to-noise ratio, lower peak-to-average power ratio and better symmetry than would otherwise be possible.)

In this example, m=k=2. That is, 50% of the bits are in the class of most important bits. Each of encoders 114 and 115 adds one redundant bit, so that r=p=3. The r=3 bits on lead 121 identify one of the eight supersymbols and the p=3 symbols on lead 122 select a particular one of the eight channel symbols within the identified supersymbol. In accordance with an important aspect of the invention, the minimum distance between the symbols of a supersymbol—that distance being denoted $d_2$—is the same as the minimum distance between the symbols in the constellation as a whole. Indeed, it can be verified by observation that this criterion is satisfied in FIG. 4. Given this characteristic, increased noise immunity for the most important bits can be provided via appropriate selection of a) the codes implemented by encoders 114 and 115 and b) the ratio $d_1/d_2$—where $d_1$ is the minimum distance between the supersymbols. (The parameter $d_1$ is given by the minimum of the distances between all the pairs of supersymbols. In turn, the distance between any pair of supersymbols is the minimum distance between any symbol of one of the pair of supersymbols and any symbol of the other.)

Specifically, a coded modulation scheme can now be constructed for the most important bits as though the eight supersymbols were eight conventional symbols in a conventional constellation. (It is true that in a conventional constellation a symbol cannot be divided into halves, as is the case for supersymbols 001, 010, 101 and 110. However, for the purpose of coding design, one may treat each of the halved supersymbols as being located in only one of its two positions.) To design such a coded modulation scheme, the eight supersymbols are partitioned, as is conventional, into a predetermined number of subsets and an appropriate code is used to encode some of the most important input bits to generate a stream of coded output bits which define a sequence of subsets. The remaining most important input bits are then used to select a supersymbol from each identified subset. In this particular example, each subset contains only a single supersymbol, i.e., there are eight subsets, and all most important input bits—i.e., the two bits on lead 112—are encoded. Thus the identification of a particular subset also identifies a particular supersymbol. It is from this particular supersymbol that the symbol that is ultimately to be transmitted will be selected as a function of the other, or less important, bits.

Importantly, it will be appreciated that this approach achieves—by virtue of the partitioning and code selected—a particular degree of noise immunity for the most important data elements that is greater than what can be achieved for the less important data elements and, indeed, is greater than what can be achieved with conventional coded modulation, all other things being equal.

As noted above, the less important bits, on lead 113, are then used to select a particular symbol from the identified supersymbol for transmission. In preferred embodiments, this selection also involves the use of coded modulation wherein at least some of the less important bits are encoded to identify a particular subset of symbols within a supersymbol and, if the subset contains more than one symbol, any remaining bits are used to select a particular one of those symbols. (The arrangement of the symbols within a supersymbol should, of course, be chosen jointly with encoder 115 to maximize its coding gain.) Again in this example, there are eight subsets of symbols within each supersymbol, i.e., one symbol per subset, and both of the less important bits on lead 113 are encoded. Thus the three coded bits on lead 122 identify, at one and the same time, both a subset and a specific symbol from the earlier identified supersymbol.

Figure 5:
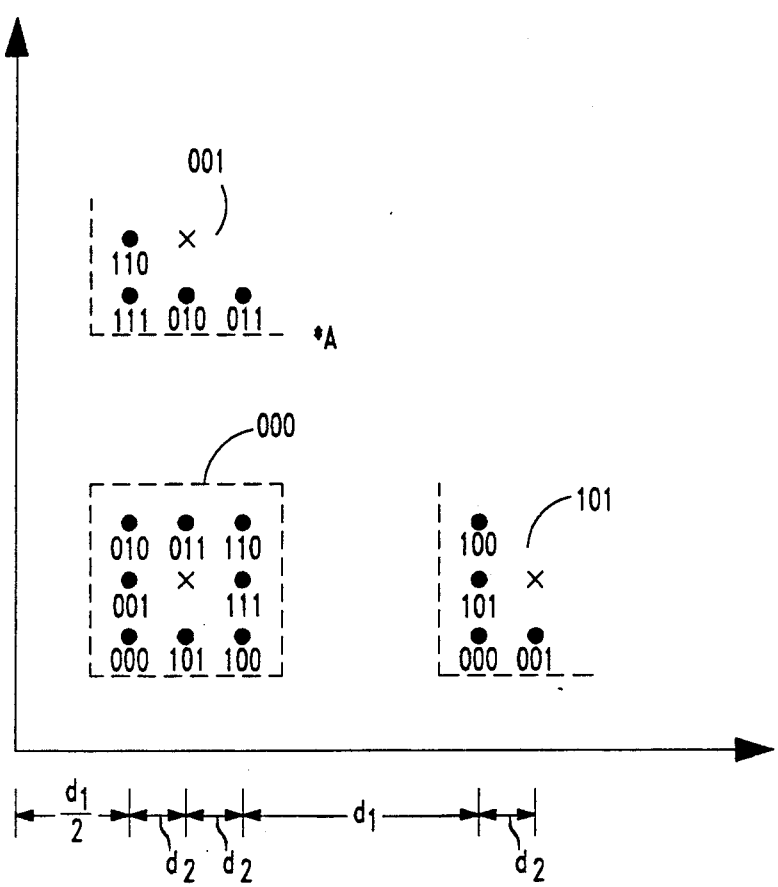
FIG. 5 shows a bit assignment scheme for the constellation of FIG. 4.
Figure 6:
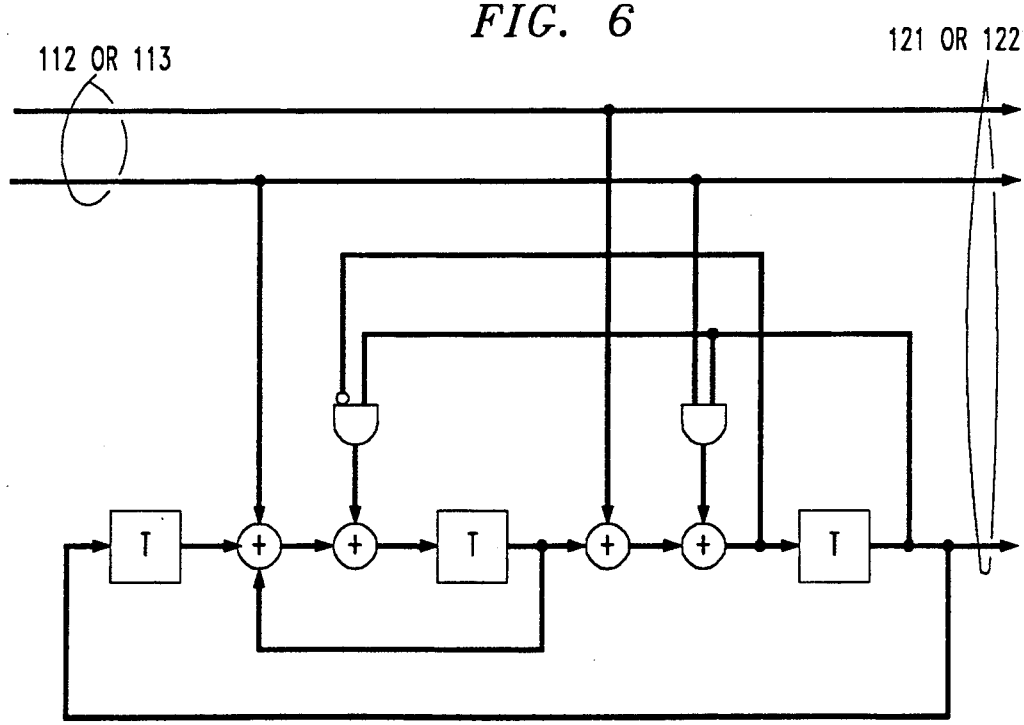
FIG. 6 shows a type of trellis encoder that can be used in the transmitter of FIG. 1.

A particular illustrative embodiment for both encoders 114 and 115 is shown in FIG. 6. (In this FIG., the boxes labelled "T" are T-second delay elements, the circles labelled "+" are exclusive-or gates, and the two-input gates are AND gates, one of which has one of its inputs inverted.) As noted above, the 3-bit output of encoder 114 identifies a particular supersymbol. Specifically, the bit values "110" output by encoder 114 on its three output leads (reading from top to bottom in FIG. 6) identifies the supersymbol labeled 110 in FIG. 4, and so forth for each of the seven other possible bit patterns. Additionally, the 3-bit output of encoder 115 selects a particular symbol within the identified supersymbol. In particular, the assignment of bit values to particular channel symbols within the supersymbols is shown in FIG. 5 for the upper right quadrant of the FIG. 4 constellation. The bit assignment scheme for the other three quadrants are arrived at by simply rotating FIG. 5. Thus, for example, the bit values "001" output by encoder 115 on its three output leads (reading from top to bottom) identifies the channel symbol labeled 001 in the identified supersymbol—there being one such symbol in each supersymbol.

Given the use of the particular trellis code implemented by the encoder of FIG. 6, various operational parameter tradeoffs can be achieved by varying the values of $d_1$ and $d_2$. Two possibilities for the constellation of FIG. 4 are shown in the table of FIG. 7. In particular, with $d_1/d_2=2.5$, a coding gain of 5.7 dB (measured, relative to an uncoded 16-QAM scheme such as shown in FIG. 3—which has the same bandwidth efficiency as the current example—at a block error rate of $10^{-3}$ for a block size of 1,000 bits) is achieved for the most important bits at a cost of a coding gain of $-2.8$ dB (i.e., a coding loss) for the less important bits. Alternatively, with $d_1/d_2=3.5$, a coding gain of 6.6 dB is achieved for the more important bits at a cost of a coding gain of $-4.6$ dB for the less important bits. The peak-to-average power ratio is about "2" (as it is for all the examples described herein), which is comparable to that achieved with conventional uncoded modulation.

Figure 2:
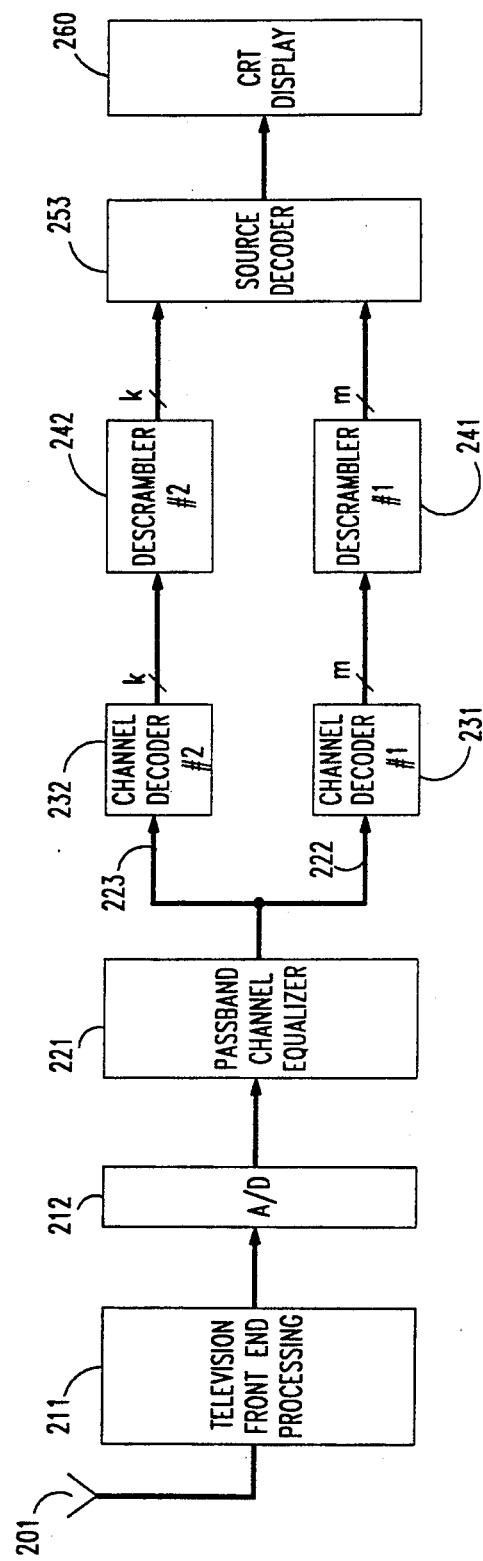
FIG. 2 is a block diagram of a receiver for transmitted signals transmitted by the transmitter of FIG. 1.

Turning now to the receiver of FIG. 2, the analog broadcast signal is received by antenna 201, is subjected to conventional television front-end processing including, for example, demodulation in processing unit 211, and is converted to digital form by A/D converter 212. The signal is then equalized by passband channel equalizer 221 and passed on parallel rails 222 and 223 to channel decoders 231 and 232. Each of the channel decoders is, illustratively, a maximum likelihood decoder, such as a Viterbi decoder. Specifically, the function of channel decoder 231 is to identify the most likely sequence of supersymbols, while the function of channel decoder 232 is to identify the most likely sequence of symbols, given that sequence of supersymbols. Thus, decoder 231 has stored within it information about the code used by channel encoder 114, while decoder 232 has stored within it information about the code used by channel encoder 115. Additionally, between the two of them these two decoders have stored within them information about the constellation being used and the manner in which the symbols are assigned to their respective supersymbols.

In channel decoder 231, the first step of decoding is to find the supersymbol or half supersymbol in each subset that is closest to the received symbol—such as the point denoted "A" in FIGS. 4 and 5. In this case, it will be remembered, there is only one supersymbol per subset. Channel decoder 231 assumes a specific single location in the signal space for each supersymbol or half supersymbol. Three such locations, denoted with a dashed "x", are shown in FIG. 4. The other locations are placed similarly. The distance between that supersymbol or half supersymbol and the received symbol is then determined. (The distance between the received symbol and a supersymbol or half supersymbol is the distance between the former and the previously defined location of the latter.) After this, decoding proceeds to find the most likely sequence of transmitted supersymbols in just the same way that a Viterbi decoder operates in a conventional coded modulation system to find the most likely sequence of conventional symbols.

The operation of channel decoder 232 will be explained with reference to FIG. 5. The first step is to rotate the received symbol by an integral multiple of 90 degrees so that the resulting symbol is always in, say, the so-called first quadrant, which is the quadrant depicted in FIG. 5. It is then determined whether the rotated symbol is closer to supersymbol 000, or one of the first-quadrant halves of supersymbols 001 and 101. After this, for each subset of symbols of the supersymbol or two supersymbol halves (in this decoding procedure, these two supersymbol halves are treated as if they belonged to the same supersymbol), the symbol that is closest to the rotated symbol is identified and the distances between them are calculated. This information is then used by channel decoder 232 to identify—for the purpose of recovering the less important bits—the most likely sequence of transmitted symbols. Alternatively stated, this determination of the most likely sequence of transmitted symbols is used only for purposes of extracting the less important bits. The more important bits are recovered from channel decoder 231 as described above.

An alternative way of realizing decoder 232 is to wait for decoder 231 to form its decision as to the identity of each supersymbol and then use this information in the recovery of the less important bits. (No rotation would be required in this case.) Such an approach has the potential advantage of allowing one to use a more complex code for the less important bits—and thereby achieve greater noise immunity for them—but at a cost of increased receiver processing delay.

Decoding in the case where multi-dimensional symbols are used—such as the four-dimensional examples described below—is carried out in a similar manner, as will be appreciated by those skilled in the art.

The bits output by decoders 231 and 232 are descrambled by descramblers 241 and 242, which respectively perform the inverse function of scramblers 110 and 111 in the transmitter. A video signal formatted so as to be displayable by, for example, a CRT display is then generated from the descrambler outputs by source decoder 253, thereby recovering the original video information, or intelligence. That signal is then applied to CRT display 260.

Numerous variations of the invention are possible. Consider, for example, the two-dimensional constellation of FIG. 8, which is comprised of four supersymbols each being comprised, in turn, of eight symbols. This constellation could be used in a system having $m=1$, $k=2$—i.e., the bandwidth efficiency is three information bits per signaling interval and the most important bits constitute 33.3% of the total—and in which each channel encoder introduces one redundant bit, i.e., $r=2$ and $p=3$. However, in order to increase the bandwidth efficiency, this same constellation can be used as the basis of a four-dimensional code which supports four information bits per signaling interval.

Figure 8:
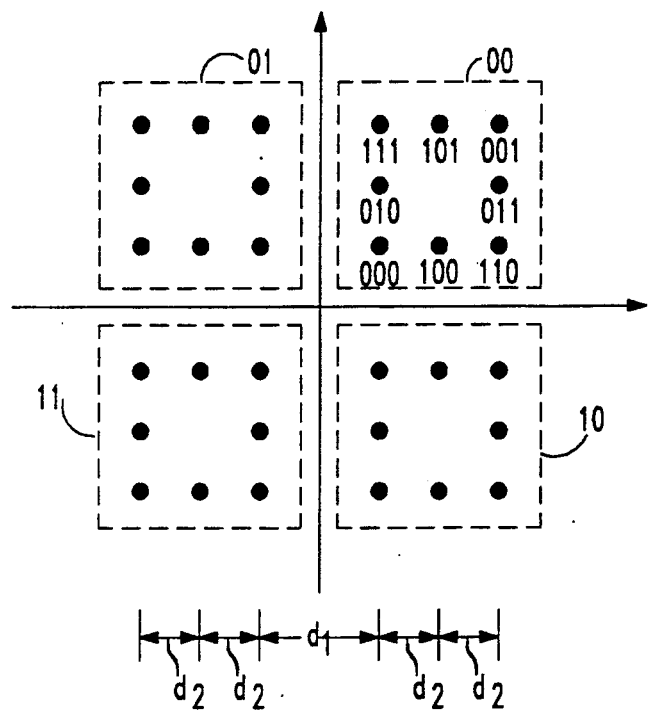
FIG. 8 depicts an alternative signal constellation that can be used in the transmitter of FIG. 1.

Specifically, the four-dimensional constellation is constructed by concatenating the constellation of FIG. 8 with itself so that each four-dimensional symbol is comprised of a first point selected from the two-dimensional constellation concatenated with a second such point. (We herein use the word "point" to refer to an element of the two-dimensional constellation of FIG. 8, thereby differentiating it from the overall coded entity, which we consistently refer to herein as a "symbol," no matter what its dimensionality. We will use the term "superpoint" in a similar way.) For this four-dimensional case, $m=3$, $k=5$ information bits are input to channel encoders 114 and 115, respectively, for each symbol interval of duration 2T. This provides an average of four information bits per signalling interval (or eight information bits per symbol interval). The more important bits in this case constitute $3/(3+5)=\frac{3}{8}=37.5\%$ of the information bits.

Figure 9:
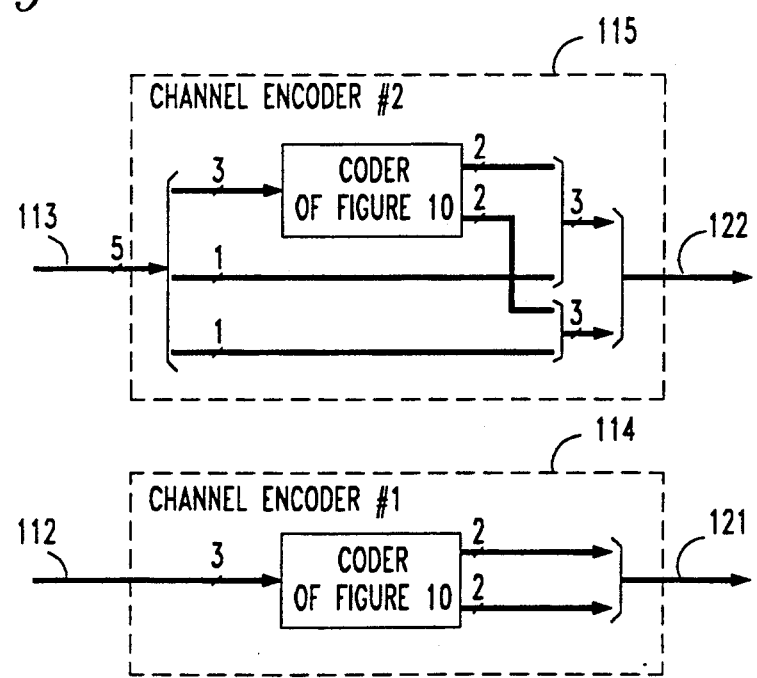
FIGS. 9–11, when taken together, show another type of trellis encoder that can be used in the transmitter of FIG. 1.

FIG. 9 shows the structure of channel encoders 114 and 115 for this four-dimensional embodiment. Encoder 114 adds a single redundant bit to its 3-bit input to provide a pair of 2-bit outputs which respectively identify first and second superpoints from FIG. 8. The first point of the four-dimensional symbol to be transmitted is to be selected from the first such superpoint and the second point of the four-dimensional symbol to be transmitted is to be selected from the second such superpoint.

The less important bits are used to provide such selection. Specifically, encoder 115 adds a single redundant bit to the 5-bit input on lead 113 to provide two 3-bit outputs which, as just noted, respectively select specific points from the first and second superpoints identified by encoder 114.

Figures 10, 11:
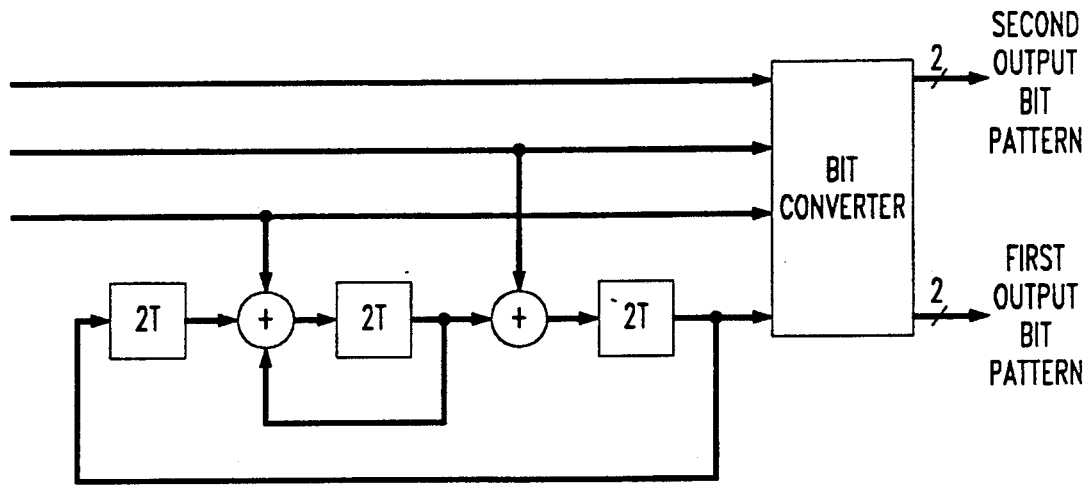

Specific circuitry for carrying out the actual encoding within channel encoders 114 and 115 is shown in FIG. 10, the bit converter of which operates in accordance with the table of FIG. 11.

The relative performances achieved for this embodiment with various values of $d_1/d_2$ are shown in FIG. 7. Note that if one is willing to have the most important bits constitute a lower percentage of the total—37.5% in this embodiment compared to 50% for the first embodiment—a greater coding gain can be achieved for such bits.

A further characteristic of coded modulation schemes based on FIG. 8—which is independent of the dimensionality of the overall code—is that it allows for the use of coded modulation schemes which are expected to provide greater immunity against impulse noise for the most important bits than other constellations, such as that shown in FIG. 4 and FIG. 12 (the latter being described below). The reason is that the positions of the various superpoints relative to one another can be defined based solely on angular, as opposed to amplitude, information.

Figure 15:
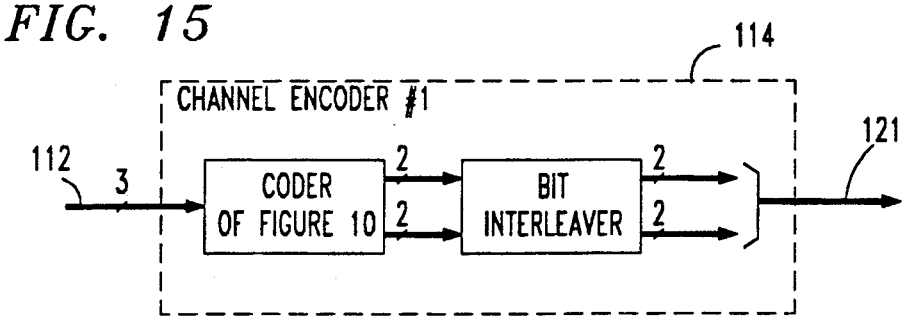
FIG. 15 shows how a bit interleaver can be added to one of the channel encoders in the transmitter of FIG. 1 to provide enhanced impulse noise immunity.

A further protection against impulse noise for the most important bits in coded modulation schemes based on constellations of the type of FIG. 8 can be achieved by rearranging the bits that are output by channel encoder 114 so that bits that are generated in proximity to one another by the encoder are separated from one another as much as possible, given that the system delay constraints are met. To this end, channel encoder 114 may include a bit interleaver, which performs such rearrangement, as shown in FIG. 15. (In the receiver, a complementary de-interleaver will, of course, be used—before channel decoder 231.) On the one hand, it can be shown that for coded modulation schemes in which the Euclidean distance between valid sequences of supersymbols is the same (with the possible exception of a scaling factor) as the Hamming distance between the sequences of bits associated with those sequences of supersymbols—which is the case for the coded modulation scheme just described—such rearrangement of the bits does not degrade the performance of the code against additive white Gaussian noise. On the other hand, however, such rearrangement provides an enhanced immunity against impulse noise. This is a result of the bursty nature of impulse noise. (Enhanced impulse noise immunity can also be achieved for coded modulation schemes which do not meet the above criteria—such as the various other schemes disclosed herein—by rearranging the two-dimensional signal points before transmitting them. This approach is somewhat less effective, however, than when the bits are rearranged.)

Figure 12:
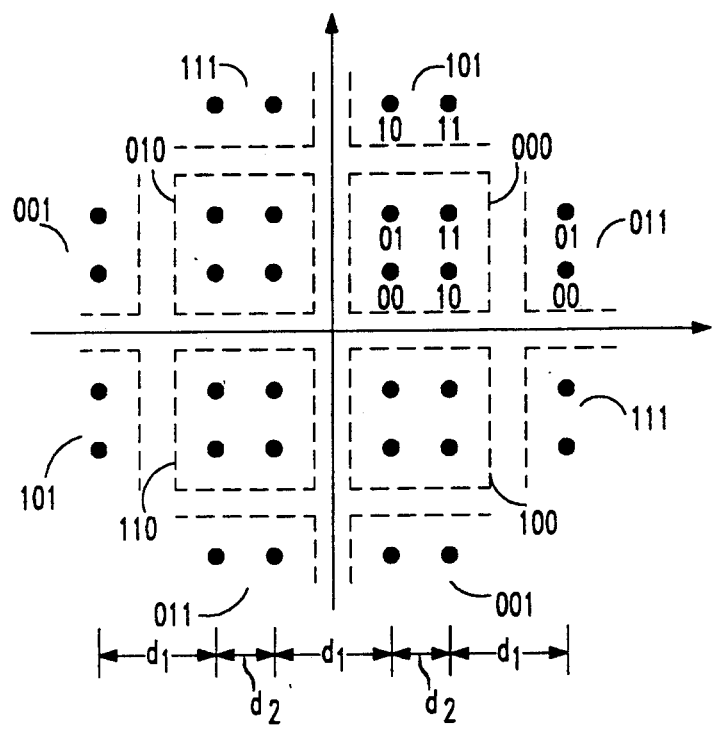
FIG. 12 depicts yet another signal constellation that can be used in the transmitter of FIG. 1.
Figure 13:
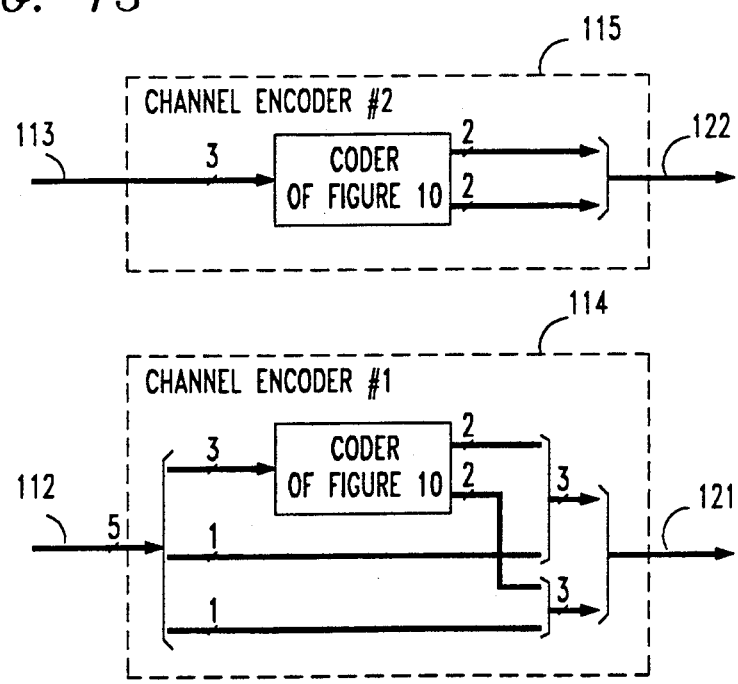
FIG. 13 shows another type of trellis encoder than can be used in the transmitter of FIG. 1.

As another alternative, consider, for example, the two-dimensional constellation of FIG. 12, which is comprised of eight supersymbols each being comprised, in turn, of four symbols. This constellation could be used in a two-dimensional signaling scheme having $m=2$, $k=1$—i.e., the bandwidth efficiency is three information bits per signaling interval and the more important bits constitute 66.7% of the total—and in which each channel encoder introduces one redundant bit, i.e., $r=3$ and $p=2$. As before, however, in order to increase the bandwidth efficiency, this same constellation can be used as the basis of a four-dimensional code. Here we would have $m=5$ and $k=3$ for an average of four information bits per signaling interval. The more important bits in this case constitute $\frac{5}{8}=62.5\%$ of the information bits. It will be appreciated that this embodiment is similar to that previously described except that the channel encoders for the most- and less-important bits are exchanged. Finally, it may be noted from FIG. 7 that the increased percentage of most important bits brings with it a decreased coding gain for those bits.

Figure 14:
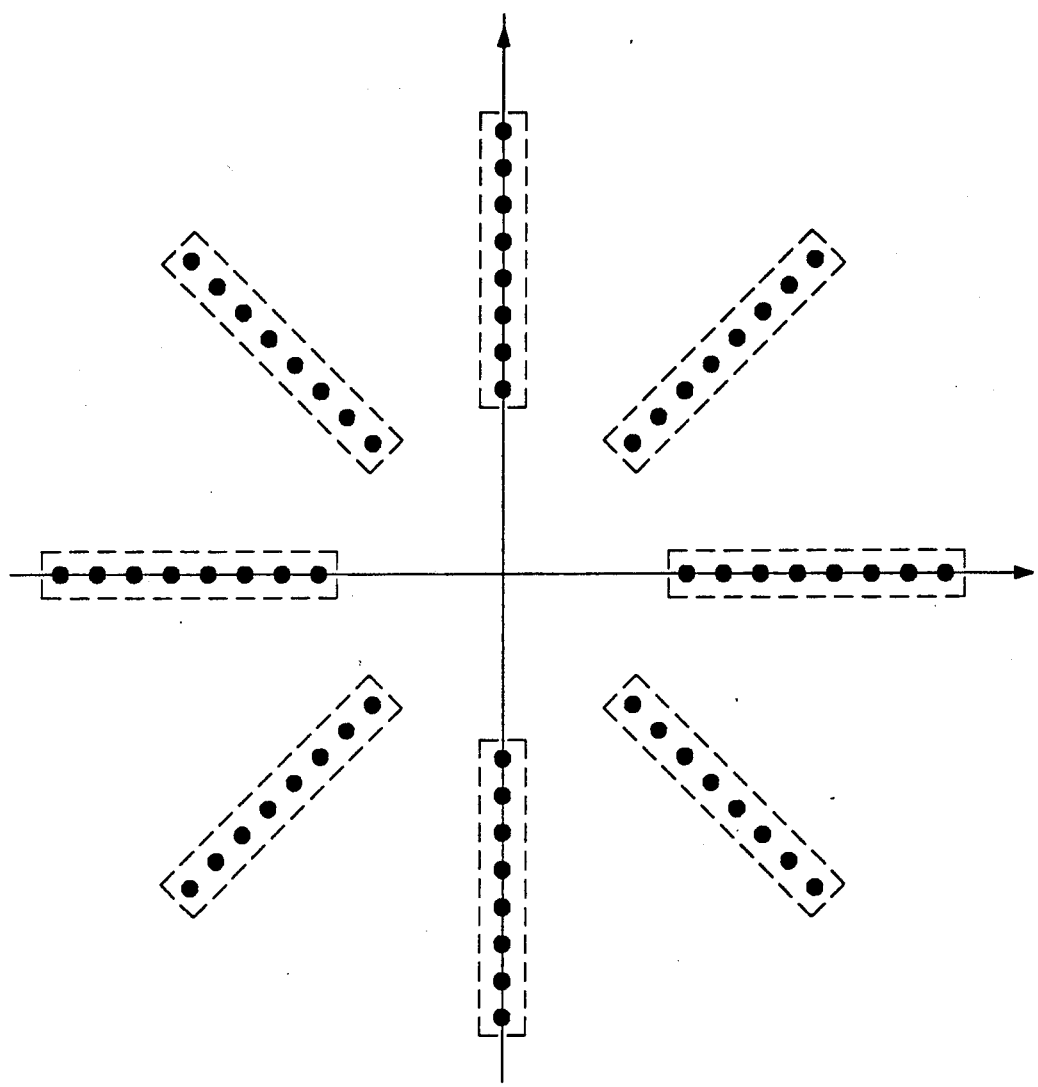
FIG. 14 depicts yet another signal constellation that can be used in the transmitter of FIG. 1.

It is also important to note that the constellations used to implement the invention need not have orthogonally aligned points, as is the case for all of the constellations described thus far. For example, the constellation of FIG. 14 has radially-aligned points. There are eight supersymbols each of which is comprised of eight symbols. This constellation can thus support a two-dimensional coded modulation scheme with $m=2$, $k=2$. Each of the supersymbols can be identified based solely on angular information. Therefore, this constellation, like that of FIG. 8, allows for the use of coded modulation schemes which are expected to provide greater immunity against impulse noise for the more important bits than other constellations.

Finally, two examples of how one might generate a television signal of the type described above will now be presented.

One approach is to perform a two-dimensional block transform on the signal—using, for example, a discrete cosine transform—to generate for each block of m-by-m picture elements (pixels or pels) a matrix of $m^2$ coefficients. These coefficients are then arranged according to their importance. "Important" coefficients, in this context, are determined by taking into account two factors—the amount of energy in the coefficient (more energy means more importance) and the perceptual importance of the various coefficients. The perceptual importance, in particular, can be determined by taking into account any number of well-known phenomena relative to the human perception of video images. For example, it is well known that a) high-frequency coding degradations are less perceptible to the viewer than low-frequency, b) blurred pictures do not appear as degraded as pictures with a great deal of granular noise, c) positions of edges are more important than non-edges in that any slight shift in the former is easily noticeable, etc. Specifically, one can devise a weighted function of the coefficient values, with higher weights being given to coefficients which a) by virtue, for example, of their location in the matrix are identified as containing low-frequency information; b) by virtue of their relationships with other coefficients can be identified as containing edge information; etc.

The value of the aforementioned function, evaluated for each coefficient, is then used as the basis for putting the coefficients into, for example, three categories—high importance, medium importance and not important. Specifically, coefficients above a first, highest threshold are put into the high importance category. Coefficients between that first threshold and a second, lower threshold are put into the medium importance category, and so forth. Coefficients in the third category are simply dropped, leaving two categories of coefficients to code—as in the illustrative embodiment. Coefficients in the first category are quantized finely and those in the second category less finely, i.e., with fewer bits per coefficient. (This utilization of different quantization levels for the various categories is not necessary to achieve the advantages of the invention in terms of providing better protection against channel-induced error, but does provide a more advantageous coding of the picture information itself.) Of course, if more than two levels of protection are provided by a particular code, the coefficients signal can be divided into the appropriate number of categories by simply defining further thresholded groupings.

The number of coefficients for which the weighted function value falls into a particular range of values will depend on the characteristics of the frame in question. However, one can assure a fixed number of coefficients—and thus a fixed number of bits in each category—by dynamic reassignment of the coefficients into the various categories by, for example, dynamically changing the aforementioned threshold values. (Information specifying which coefficients have been put into which categories would have to be communicated to the receiver as some form of "side" information.")

In accordance with a second possible scheme, temporal redundancy is removed first by computing a motion compensated prediction error in well-known fashion. The error is then processed by a two-dimensional m-by-m transform as in the first approach. The transform coefficients are once again arranged in order of importance and then divided into categories, each having its respective level of quantization. Again, there could be, for example, three categories—most important, less important and not important. Dropping the latter again leaves two categories, as desired for the embodiment of FIG. 1. The more important coefficients would not only be transmitted, but also used in the motion compensated DPCM coder loop (after being inversely transformed) in standard fashion. The less important coefficients would not be used in that loop.

For either of these, or other, schemes, there is other information that needs to be transmitted that would typically be regarded as being in the "most important" category. Such information—which would typically be multiplexed or otherwise combined with the bit stream which represents the most important picture information—would include, for example, framing information and audio, as well as the aforementioned "side information."

The foregoing merely illustrates the principles of the invention. For example, it is assumed in FIG. 1 that only one broadcast signal polarization is used. However, it is possible to double the bandwidth efficiency of the scheme by using a second set of coding circuitry to encode a second source-coded data stream in parallel with the first and to transmit the resulting coded modulated signal using a second polarization. Alternatively, a single data coding rail can be employed but its speed can be doubled by transmitting alternate signal points on the two polarizations.

It should be noted that, although in all the examples shown herein, the less important bits are always coded, this is not necessary. That is, uncoded bits can be used to select a symbol from the identified supersymbol. It should also be noted that, although in all of the examples shown herein, the minimum distance $d_1$ between superpoints is always greater than the minimum distance $d_2$ between points, this is not necessary. For example, $d_1$ can be equal to $d_2$ in FIG. 8. It should also be noted that, although in all the examples shown herein, only two classes of data elements are accommodated, the invention is not so limited. As many classes of data elements as desired can, in fact, be accommodated by dividing the class of less important bits into two or more subclasses and applying the principles of the invention to the coding of those subclasses in straightforward fashion. Moreover, although all the examples shown herein code either three or four information bits at a time, the invention is not in any way limited to these.

In the examples shown herein, encoders 114 and 115 are always of the same dimensionality. However, this is not necessary. For example, a two-dimensional code could be used for the more important data elements to identify a sequence of superpoints of a predetermined two-dimensional constellation. A four-dimensional code could then be used for the less important data elements to select points from sequential pairs of superpoints from that sequence. Conversely, a four-dimensional code could be used for the more important data elements and a two-dimensional code for the less important data elements.

In the examples shown herein, encoders 114 and 115 always implement 8-state trellis codes. However, this is not necessary. Codes having other than 8 states are equally usable. Moreover, other types of codes, such as block codes, can be used instead of trellis codes.

In some applications, it may be desired to provide for the possibility of phase rotations in the received signal caused by channel disturbance. In such applications, differential encoding circuitry may be included within channel encoder 114 to take care of this problem.

In addition, the invention is illustrated herein in the context of a digital video transmission system. However, it is equally applicable to other types of digital transmission systems. Moreover, although particular constellations are shown herein, numerous other constellations, which may be of any desired dimensionality, can be used.

It may also be noted that although the invention is illustrated herein as being implemented with discrete functional building blocks, e.g., source coders, scramblers, etc., the functions of any one or more of those building blocks can be carried out using one or more appropriate programmed processors, digital signal processing (DSP) chips, etc. Thus although each of the various "means" recited in the claims hereof may correspond, in some embodiments, to specific circuitry which is specifically designed to perform the function of just that means, it will be appreciated that such "means" may alternatively correspond, in other embodiments, to the combination of processor-based circuitry combined with stored program instructions which cause that circuitry to perform the function in question.

It will thus be appreciated that those skilled in the art will be able to device numerous and various alternative arrangements which, although not explicitly shown or described herein, embody the principles of the invention and are within its spirit and scope.

I claim:

1. A method comprising the steps of
encoding a first group of data elements to generate a first expanded group of data elements,
identifying one of a plurality of supersymbols of a predetermined channel symbol constellation in response to the first expanded group of data elements, each supersymbol being comprised of a respective plurality of symbols of the constellation,
selecting an individual one of the symbols of the identified supersymbol at least in response to a second group of data elements, and
applying to a communication channel a signal representing the selected symbol,
the minimum distance between at least ones of the symbols of at least one of the supersymbols being the same as the minimum distance between the symbols of the constellation as a whole.

2. The invention of claim 1 wherein the selecting step includes the steps of
encoding said second group of data elements to generate a second expanded group of data elements, and
selecting said individual symbol in response to the second expanded group of data elements.

3. The invention of claim 1 wherein said encoding step includes the step of trellis coding said first group of data elements.

4. The invention of claim 1 comprising the further step of generating said data elements by source coding input information in such a way that said first group of data elements represents a portion of said information that is more important than the portion of said information represented by said second group of data elements.

5. The invention of claim 4 wherein said information is television information.

6. The invention of claim 1 comprising the further step of rearranging the first expanded group of data elements prior to said identifying step.

7. The invention of claim 1 wherein at least one of said supersymbols is comprised of at least two non-contiguous groups of symbols.

8. A method of channel coding successive groups of m+k data bits associated with respective symbol intervals, said method comprising the steps, performed for each said interval, of
encoding m of the bits of one of the groups to generate an expanded group of r bits, r>m,
identifying a particular one of $2^r$ supersymbols of a predetermined channel symbol constellation as a function of the values of said r bits, each of said supersymbols being comprised of a plurality of symbols of said constellation, and
generating a signal representing a selected one of the channel symbols of the identified one supersymbol, the selection being performed as a function of the values of the other k bits of said one group,
the minimum distance between the symbols of each supersymbol being the same as the minimum distance between the symbols of the constellation as a whole.

9. The invention of claim 8 comprising the further step of generating said data bits by source coding input information in such a way that said m bits represent a portion of said information that is more important than the portion of said information represented by said k bits.

10. The invention of claim 9 wherein said information is television information.

11. The invention of claim 10 wherein the generating step includes the steps of
encoding the other k bits of said one of the groups to generate an expanded group of p bits, p>k, and
selecting said individual symbol in response to said expanded group of p bits.

12. The invention of claim 8 comprising the further step of rearranging said expanded group of r bits prior to said identifying step.

13. The invention of claim 11 wherein said m-bit encoding step includes the step of trellis coding said m bits, and said k-bit encoding step includes the step of trellis coding said k bits.

14. The invention of claim 12 wherein at least ones of said supersymbols are each comprised of at least two non-contiguous groups of symbols.

15. A method for use in a receiver which receives intelligence communicated to said receiver by a transmitter, said transmitter being adapted to channel code successive groups of m+k data bits associated with respective symbol intervals via the steps, performed for each said interval, of a) encoding m of the bits of one of the groups using a first predetermined code to generate an expanded group of r bits, r>m; b) identifying a particular one of $2^r$ supersymbols of a predetermined channel symbol constellation as a function of the values of said r bits, each of said supersymbols being comprised of a plurality of symbols of said constellation assigned thereto and the minimum distance between the symbols of each supersymbol being the same as the minimum distance between the symbols of the constellation as a whole; c) generating a signal representing a selected one of the channel symbols of the identified one supersymbol, the selection being performed as a function of the values of the other k bits of said one group; and d) communicating said signal to said receiver over a communication channel;
said method comprising the steps of
receiving said signal from said channel, and
recovering said intelligence from the received signal, said recovering being carried out in response to information stored in said receiver about said first predetermined code, about said constellation, and the manner in which said symbols are assigned to their respective supersymbols.

16. The invention of claim 15 wherein the signal generating step in the transmitter includes the steps of a) encoding the other k bits of said one of the groups using a second predetermined code to generate a second expanded group of p bits, p>k; and b) selecting said individual symbol in response to the second expanded group of data bits,
and wherein said recovering step is carried out further in response to information stored in said receiver about said second predetermined code.

17. The invention of claim 16 wherein said intelligence is television information.

18. The invention of claim 17 wherein said recovering step includes the step of decoding the received signal to recover said successive groups of data bits using maximum likelihood decoding.

19. Apparatus for channel coding first and second streams of data elements, said apparatus comprising means for encoding said first stream of data elements to generate a first expanded stream of data elements, means for identifying a sequence of supersymbols of a predetermined channel symbol constellation in response to the first expanded stream of data elements, means for selecting an individual one of the symbols of each supersymbol of said sequence at least in response to said second stream of data elements, and means for applying to a communication channel a signal representing the selected symbols, the minimum distance between at least ones of the symbols of at least one of the supersymbols being the same as the minimum distance between the symbols of the constellation as a whole.

20. The invention of claim 19 wherein said selecting means includes means for encoding said second stream of data elements to generate a second expanded stream of data elements, and means for selecting said individual one of the symbols of each supersymbol in response to said second expanded stream of data elements.

21. The invention of claim 20 wherein each of said encoding means includes a trellis encoder.

22. The invention of claim 20 further comprising means for generating said data elements by source coding input information in such a way that said first stream of data elements represents a portion of said information that is more important than the portion of said information represented by said second stream of data elements.

23. The invention of claim 19 wherein said first and second streams of data elements represent television information.

24. The invention of claim 23 wherein each of said supersymbols is comprised of a plurality of symbols of said constellation and wherein at least ones of said supersymbols are each comprised of at least two non-contiguous groups of symbols.

25. The invention of claim 19 further comprising means for rearranging the first expanded stream of data elements prior to said identifying.

26. Apparatus operative during each of a succession of symbol intervals for channel coding respective groups of m+k data bits, said apparatus comprising, means for encoding m of the bits of one of the groups to generate an expanded group of r bits, r>m, means for identifying a particular one of $2^r$ supersymbols of a predetermined channel symbol constellation as a function of the values of said r bits, each of said supersymbols being comprised of a plurality of symbols of said constellation, and means for generating a signal representing a selected one of the channel symbols of the identified one supersymbol, the selection being performed as a function of the values of the other k bits of said one group, the minimum distance between the symbols of each supersymbol being the same as the minimum distance between the symbols of the constellation as a whole.

27. The invention of claim 26 wherein said data bits represent television information.

28. The invention of claim 27 further comprising means for generating said data bits by source coding input information in such a way that said m bits represent a portion of said information that is more important than the portion of said information represented by said k bits.

29. The invention of claim 28 wherein said generating means includes means for encoding the other k bits of said one of the groups to generate an expanded group of p bits, p>k, and means for selecting said individual symbol in response to said expanded group of p bits.

30. The invention of claim 29 wherein said m-bit and k-bit encoding means include means for trellis coding said m and k bits, respectively.

31. The invention of claim 29 wherein at least ones of said supersymbols are each comprised of at least two non-contiguous groups of symbols.

32. The invention of claim 30 further comprising means for rearranging said expanded group of r bits prior to said identifying step.

33. An arrangement for use in a receiver which receives intelligence communicated to said receiver by a transmitter, said transmitter including apparatus for a) encoding a first stream of the data elements using a first predetermined code to generate a first expanded stream of data elements; b) identifying a sequence of supersymbols of a predetermined channel symbol constellation in response to the first expanded stream of data elements, the minimum distance between at least ones of the symbols of at least one of the supersymbols being the same as the minimum distance between the symbols of the constellation as a whole; c) encoding a second stream of data elements using a second predetermined code to generate a second expanded stream of data elements; d) selecting an individual one of the symbols of each supersymbol of said sequence at least as a function of the second expanded stream of data elements; and d) means for applying to a communication channel a signal representing the selected symbols, said arrangement comprising means for receiving the signal from the communication channel, and means for carrying out a maximum likelihood decoding operation on the received signal to recover said first stream of data elements and for carrying out a second maximum likelihood decoding operation on the received signal to recover said second stream of data elements.

34. The invention of claim 33 wherein said first and second codes are trellis codes.

35. The invention of claim 33 wherein said intelligence is television information.

* * * * *